(12) United States Patent
Ishige et al.

(10) Patent No.: US 10,361,532 B2
(45) Date of Patent: Jul. 23, 2019

(54) SEMICONDUCTOR LASER MODULE AND SEMICONDUCTOR LASER MODULE MANUFACTURING METHOD

(71) Applicant: FURUKAWA ELECTRIC CO., LTD., Tokyo (JP)

(72) Inventors: Yuta Ishige, Tokyo (JP); Etsuji Katayama, Tokyo (JP); Toshio Kimura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/034,762

(22) Filed: Jul. 13, 2018

(65) Prior Publication Data
US 2018/0335582 A1    Nov. 22, 2018

Related U.S. Application Data

(63) Continuation of application No. PCT/JP2017/001058, filed on Jan. 13, 2017.

(30) Foreign Application Priority Data

Jan. 14, 2016 (JP) .................................. 2016-004998

(51) Int. Cl.
| | |
|---|---|
| *H01S 5/00* | (2006.01) |
| *H01S 5/022* | (2006.01) |
| *H01S 5/40* | (2006.01) |
| *G02B 6/42* | (2006.01) |

(Continued)

(52) U.S. Cl.
CPC ............ *H01S 5/02252* (2013.01); *G02B 6/42* (2013.01); *G02B 27/0922* (2013.01);
(Continued)

(58) Field of Classification Search
CPC .......... H01S 5/022; H01S 5/40; H01S 5/4012; H01S 5/4022; H01S 5/4056;
(Continued)

(56) References Cited

U.S. PATENT DOCUMENTS

| | | | |
|---|---|---|---|
| 6,487,224 B1 * | 11/2002 | Ohashi ................. | G02B 6/4214 372/36 |
| 8,432,945 B2 | 4/2013 | Faybishenko | |

(Continued)

FOREIGN PATENT DOCUMENTS

| | | |
|---|---|---|
| JP | 2009-128689 A | 6/2009 |
| JP | 2013-152385 A | 8/2013 |

(Continued)

OTHER PUBLICATIONS

International Search Report issued in PCT Patent Application No. PCT/JP2017/001058 dated Mar. 21, 2017.

*Primary Examiner* — Kinam Park
(74) *Attorney, Agent, or Firm* — Marshall, Gerstein & Borun LLP

(57) ABSTRACT

Semiconductor lasers are arranged in a plurality of columns. The columns of the respective semiconductor lasers include semiconductor laser installed columns. Reflecting mirrors in the respective semiconductor laser installed columns reflect light in substantially the same axial direction as viewed from above, and constitute beam groups. The beam groups of the respective semiconductor laser installed columns are formed on both sides in a width direction of a housing. That is, the beam groups are configured for each of the semiconductor laser installed columns, and the respective beam groups are formed on mutually different axes as viewed from above.

9 Claims, 9 Drawing Sheets

(51) Int. Cl.
*G02B 27/09* (2006.01)
*G02B 27/10* (2006.01)
*G02B 27/12* (2006.01)

(52) U.S. Cl.
CPC ............ *G02B 27/106* (2013.01); *H01S 5/022* (2013.01); *H01S 5/40* (2013.01); *H01S 5/405* (2013.01); *H01S 5/4012* (2013.01); *H01S 5/4025* (2013.01); *H01S 5/4056* (2013.01); *H01S 5/4081* (2013.01); *G02B 27/0961* (2013.01); *G02B 27/0966* (2013.01); *G02B 27/123* (2013.01); *H01S 5/0228* (2013.01); *H01S 5/02284* (2013.01); *H01S 5/02288* (2013.01); *H01S 5/02292* (2013.01)

(58) Field of Classification Search
CPC .. H01S 5/4081; H01S 5/02252; H01S 5/0228; H01S 5/02288; H01S 5/0229
See application file for complete search history.

(56) References Cited

U.S. PATENT DOCUMENTS

| | | |
|---|---|---|
| 2009/0323752 A1 | 12/2009 | Chuyanov et al. |
| 2012/0002395 A1* | 1/2012 | Du ........................ H01S 5/4012 |
| | | 362/19 |
| 2014/0333902 A1 | 11/2014 | Aboshi et al. |
| 2015/0131692 A1* | 5/2015 | Hayamizu ............ G02B 6/4206 |
| | | 372/107 |
| 2017/0222401 A1* | 8/2017 | Zimer ................. H01S 3/08054 |
| 2018/0191135 A1* | 7/2018 | Yanase .................... H01S 5/022 |
| 2018/0198258 A1* | 7/2018 | Chen ....................... H01S 5/405 |

FOREIGN PATENT DOCUMENTS

| | | |
|---|---|---|
| WO | WO-2016/203998 A1 | 12/2016 |
| WO | WO-2017/026358 A1 | 2/2017 |

* cited by examiner

SEMICONDUCTOR LASER MODULE AND SEMICONDUCTOR LASER MODULE MANUFACTURING METHOD

TECHNICAL FIELD

The present disclosure relates to a compact and easy-to-assemble semiconductor laser module and the like.

BACKGROUND

Semiconductor laser modules in which light emitted from a plurality of semiconductor lasers is coupled into an optical fiber have been conventionally available. Inside a housing of the semiconductor laser module, a plurality of semiconductor lasers are provided side by side. This means that, as the number of installed semiconductor lasers increases, the length of the semiconductor laser module increases. Thus, more compact semiconductor laser modules have been in demand.

As such a semiconductor laser module, there is a semiconductor laser module, for example, in which a plurality of lasers are arranged so as to face each other, with lenses and mirrors corresponding to each of the semiconductor lasers being arranged in a plurality of tiers in a height direction, and coupled into an optical fiber (U.S. Pat. No. 8,432,945, for example).

FIG. 8 is a plan view showing a conventional semiconductor laser module 100 disclosed in Patent Document 1. FIG. 8 is an upper perspective view of a housing 103. The semiconductor laser module 100 mainly includes the housing 103, semiconductor lasers 105, lenses 107 and 109, reflecting mirrors 111, a condenser lens 115, an optical fiber 119, and so on.

The semiconductor lasers 105, the lenses 107 and 109, the reflecting mirrors 111, the condenser lens 115, the optical fiber 119, and the like are disposed inside the housing 103. The semiconductor laser module 100 has a plurality of columns of the semiconductor lasers 105 disposed to improve installation efficiency of the semiconductor lasers 105. That is, a plurality of semiconductor laser installed columns 121a and 121b are provided.

A base portion of the housing 103 is in a staircase-like form so as to increase its height. Each step serves as a semiconductor laser installation platform 117. The semiconductor laser 105 is installed on each of the semiconductor laser installation platforms 117.

Also, the semiconductor lasers 105 in each of the semiconductor installed columns 121a and 121b are disposed on the semiconductor laser installation platforms 117 at different heights. Thus, the semiconductor lasers 105 disposed in the semiconductor installed columns 121a and 121b respectively are disposed at all different heights with a uniform pitch.

In each of the semiconductor installed columns 121a and 121b, the lenses 107 are disposed in front (in an emitting direction) of the semiconductor lasers 105. Also, the lenses 109 are disposed further ahead thereof. The lenses 107 and 109 collimate light emitted from the semiconductor lasers 105 in vertical and horizontal directions, respectively. The lenses 107 and 109 are disposed for the every semiconductor laser 105.

Here, the semiconductor lasers 105 in each of the semiconductor installed columns 121a and 121b are disposed so as to face each other and radiate laser beams toward the center of the housing 103 in a width direction thereof. At the center of the housing 103, the reflecting mirrors 111 are disposed approximately in a line. The reflecting mirror 111 is disposed on the installation platform at the same height as the each corresponding semiconductor laser 105.

The light emitted from the semiconductor lasers 105 in the semiconductor installed columns 121a and 121b and collimated by the lenses 107 and 109 is reflected on the reflecting mirrors 111 and changes its direction approximately perpendicularly. At this time, the light emitted from the semiconductor lasers 105 in the semiconductor installed columns 121a and the light emitted from the semiconductor lasers 105 in the semiconductor installed columns 121b are reflected in a same axis direction when viewed from above.

The light reflected by the respective reflecting mirrors 111 (a beam group 123) is condensed by the condenser lens 115 and optically coupled to the optical fiber 119.

FIG. 9 is a schematic view showing an arrangement of the semiconductor laser 105 and the reflecting mirror 111. Light radiated by the semiconductor laser 105 (an arrow X in the drawing) has a predetermined angle of beam divergence (θ in the drawing). This divergence is collimated by the lens 109 and then reflected on the reflecting mirror 111 (an arrow Y in the drawing).

Here, the installation efficiency of the semiconductor lenses 105 is highest when an installation pitch for the semiconductor lasers 105 (pD in FIG. 8) is equal to a width of the semiconductor laser 105 (WS in FIG. 9). Also, the semiconductor lasers 105 in each of the semiconductor installed columns 121a and 121b are disposed being shifted for half a pitch and facing each other.

Thus, to avoid interference between the reflecting mirrors 111 that reflect the light from right and left respectively, it is required that an effective reflecting width SA of the reflecting mirror 111 is less than half of WS (=pD). For example, when a thickness of the reflecting mirror 111 is 0, SA=pD/2. However, when the thickness of the reflecting mirror is considered, the effective reflecting width SA of the reflecting mirror 111 becomes less than pD/2.

As above, it is impossible to have an enough wide effective reflecting width SA of the reflecting mirror 111 in the conventional semiconductor laser module. This leads to a problem that the semiconductor laser 105 with large θ cannot be used.

On the other hand, if the reflecting mirror 111 with a wider width is to be used, it is required to increase the installation pitch pD of the semicondutor laser 105 larger than the width WS of the semiconductor laser 105. That is, it is necessary to provide a clearance between the semiconductor lasers 105.

However, this decreases the installation efficiency of the semiconductor lasers 105. The semiconductor lasers 105 are divided into the semiconductor laser installed columns 121a and 121b and light from the semiconductor lasers 105 is condensed to improve the installation efficiency of the semiconductor lasers 105. However, if the semiconductor lasers 105 are disposed being kept apart, then it is impossible to obtain sufficient effects from providing a plurality of the semiconductor installed columns 121a and 121b.

On the other hand, to cope with the narrower effective reflecting width SA of the reflecting mirror 111, there is a way to decrease a distance between the semiconductor laser 105 and the lens 109 (EFLSAC in FIG. 9).

FIG. 10 is a schematic view showing a relationship between the semiconductor laser 105 and the lens 109. As mentioned above, light X radiated from the semiconductor laser 105 has the predetermined angle of divergence a θ. This light X enters into the lens 109 within a range that is determined by θ and EFLSAC.

Here, the light enetering a proximity of an edge portion of the lens 109 in a width direction thereof is not collimated completely and may cause a deviation. This deviation is called spherical aberration. Spherical aberration is known to be proportional to 1/R2 of a spherical surface of the lens 109. Thus, to reduce the spherical aberration, it is required to increase R.

However, to increase R, it is effective to increase EFLSAC. Thus, to reduce the spherical aberration, it is required to have sufficient EFLSAC. This means that, in order to reduce the influence of the spherical aberration, it is difficult to decrease the distance EFLSAC between the semiconductor laser 105 and the lens 109.

Also, as shown in FIG. 8, in the conventional method, a step pitch of the semiconductor laser installation platforms 117 in the respective semiconductor laser installed columns 121a and 121b is different from a step pitch of the installation platforms for the reflecting mirrors 111. Thus, adjusting the each reflecting mirror 111 is difficult and assembly is difficult.

For these reasons, easy-to-assemble semiconductor laser modules with improved installation efficiency of the semiconductor lasers 105 and small optical deviation due to spherical aberration are demanded.

SUMMARY OF THE DISCLOSURE

The present disclosure was made in view of such problems. Its object is to provide a compact and easy-to-assemble semiconductor laser module, and the like.

To achieve the above object, a first embodiment is a semiconductor laser module including a housing, a plurality of semiconductor lasers provided inside the housing, a lens that collimates laser beams emitted by the respective semiconductor lasers, and a plurality of primary reflecting mirrors that reflect the laser beams respectively. The plurality of the semiconductor lasers are disposed on semiconductor laser installation platforms, which are formed as a staircase, at different heights so as to gradually raise heights thereof with regard to a base portion of the housing, forming a semiconductor laser installed column. A plurality of the semiconductor laser installed columns are installed, with heights of the semiconductor laser installation platforms of the respective semiconductor laser installed columns being different from each other. The primary reflecting mirrors that are included in the same semiconductor laser installed column reflect light in an approximately same axis direction to form a beam group. The beam groups for the respective semiconductor laser installed columns are formed on different axes in upper view. Secondary reflecting mirrors that reflect the beam groups are provided for the respective semiconductor laser installed columns and the respective secondary reflecting mirrors reflect the plurality of the beam groups collectively onto a same axis.

It is preferable that the semiconductor laser module further includes a condenser lens that condenses the beam groups reflected by the secondary reflecting mirrors respectively, and an optical fiber to which the beam groups condensed by the condenser lens are optically coupled.

The first embodiment may also be a semiconductor laser module including a housing, a plurality of semiconductor lasers provided inside the housing, a lens that collimates laser beams emitted by the respective semiconductor lasers, and a plurality of primary reflecting mirrors that reflect the laser beams respectively, in which the plurality of the semiconductor lasers are disposed on semiconductor laser installation platforms, which are formed as a staircase, at different heights so as to gradually raise heights thereof with regard to a base portion of the housing, the plurality of the semiconductor lasers forming a semiconductor laser installed column; a plurality of the semiconductor laser installed columns are installed; the primary reflecting mirrors that are included in the same semiconductor laser installed column reflect light in an approximately same axis direction to form a beam group; and the beam groups for the respective semiconductor laser installed columns are formed on different axes in upper view, the semiconductor laser module including secondary reflecting mirrors that reflect the beam groups for the respective semiconductor laser installed columns; a condenser lens that condenses the beam groups reflected by the secondary reflecting mirrors, respectively; and an optical fiber to which the beam groups condensed by the condenser lens are optically coupled, and the secondary reflecting mirrors may change a height of the beam group for at least one of the semiconductor laser installed columns and the beam groups for the respective semiconductor laser installed columns do not overlap in a height direction and are led into the condenser lens.

It is preferable that a staircase-like member forming the semiconductor laser installation platforms is a separate body from the housing and is joined on a base portion of the housing.

At least a pair of the semiconductor laser installed columns may include the respective semiconductor lasers that are adjoined to each other back to back, and respective emitting directions of the pair of the semiconductor laser installed columns may be in opposite directions from each other.

According to the first embodiment, since the beam groups for the respective semiconductor laser installed columns are formed on different axes when viewed from the above and the secondary reflecting mirrors reflect the respective beam groups to be condensed onto the same axis, the primary reflecting mirrors do not interfere with each other. This allows the primary reflecting mirror to have an enough effective reflecting width even if the semiconductor lasers are disposed without intervals. Thus, the semiconductor laser with a large θ is applicable and an enough distance EFLSAC can be obtained.

Also, the condenser lens can optical couple the respective beam groups reflected by the secondary reflecting mirrors to the optical fiber.

Also, by forming the staircase-like members, which include the semiconductor laser installation platforms, separately from the housing, the semiconductor lasers, lenses, and the primary reflecting mirrors can be disposed on the staircase-like member while being adjusted, and, lastly, the staircase-like member can be joined to the base portion of the housing. Also with the secondary reflecting mirrors, the positioning alignment with the condenser lens is possible, which requires no positioning adjustment for the secondary reflecting mirrors with the respective semiconductor lasers. Thus, assembling of the semiconductor laser module is easy.

Also, the semiconductor lasers in at least a pair of the semiconductor laser installed columns are disposed and adjoined back to back. This facilitates wiring of the semiconductor lasers and can shorten the wiring.

A second embodiment is a method for manufacturing a semiconductor laser module using a staircase-like member formed as a staircase to gradually raise a height, and including a 'step a' of installing semiconductor lasers at each of semiconductor laser installation platforms at different heights of the staircase-like member, installing lenses for collimating laser beams emitted by the semiconductor lasers, installing a plurality of primary reflecting mirrors for reflecting the laser beams, and forming a semiconductor laser installed column, a 'step b' of fixing a plurality of the semiconductor laser installed columns on a base portion of a housing, and a 'step c' of fixing secondary reflecting mirrors for each of the semiconductor laser installed columns on the base portion of the housing, the secondary reflecting mirrors reflect light reflected by the primary reflecting mirrors, respectively, to an approximately same axis direction in upper view. A plurality of columns of the semiconductor laser installed columns are installed on the base portion and the heights of the semiconductor laser installation platforms of each of the semiconductor laser installed columns are different from each other. The primary reflecting mirrors in each of the semiconductor laser installed columns reflect light to an approximately same axis direction in upper view to form a beam group. The beam groups for the respective semiconductor laser installed columns are formed on different axes. In the 'step c', adjusting the secondary reflecting mirrors can lead the beam groups reflected by the respective primary mirrors to a condenser lens and the condenser lens can optically couple the beam groups into an optical fiber.

Alternatively, the second embodiment may be a method for manufacturing a semiconductor laser module using a staircase-like member formed as a staircase to gradually raise a height and including a 'step a' of installing semiconductor lasers at each of semiconductor laser installation platforms at different heights of the staircase-like member, installing lenses for collimating laser beams emitted by the semiconductor lasers, installing a plurality of primary reflecting mirrors for reflecting the laser beams, and forming a semiconductor laser installed column, a 'step b' of fixing a plurality of the semiconductor laser installed columns on a base portion of a housing, and a 'step c' of fixing secondary reflecting mirrors for each of the semiconductor laser installed columns on the base portion of the housing, the secondary reflecting mirrors reflect light reflected by the primary reflecting mirrors, respectively, to an approximately same axis direction in upper view. A plurality of the semiconductor laser installed columns are installed on the base portion. The primary reflecting mirrors in each of the semiconductor laser installed columns reflect light to an approximately same axis direction in upper view to form a beam group. The beam groups for the respective semiconductor laser installed columns are formed on different axes. The secondary reflecting mirrors for at least one of the semiconductor laser installed columns change the height of the beam group and the beam groups for the respective semiconductor laser installed columns can be led into a condenser lens without overlapping in a height direction, and in the 'step c', adjusting the secondary reflecting mirrors can lead the beam groups reflected by the respective primary mirrors to a condenser lens and the condenser lens can optically couple the beam groups into an optical fiber.

According to the second embodiment, a compact semiconductor laser module can be easily assembled.

The presently disclosed embodiments can provide a compact and easy-to-assemble semiconductor laser module, and the like.

BRIEF DESCRIPTION OF DRAWINGS

FIG. 6 is a perspective view showing a semiconductor laser module 1a.

DETAILED DESCRIPTION

Figure 1:
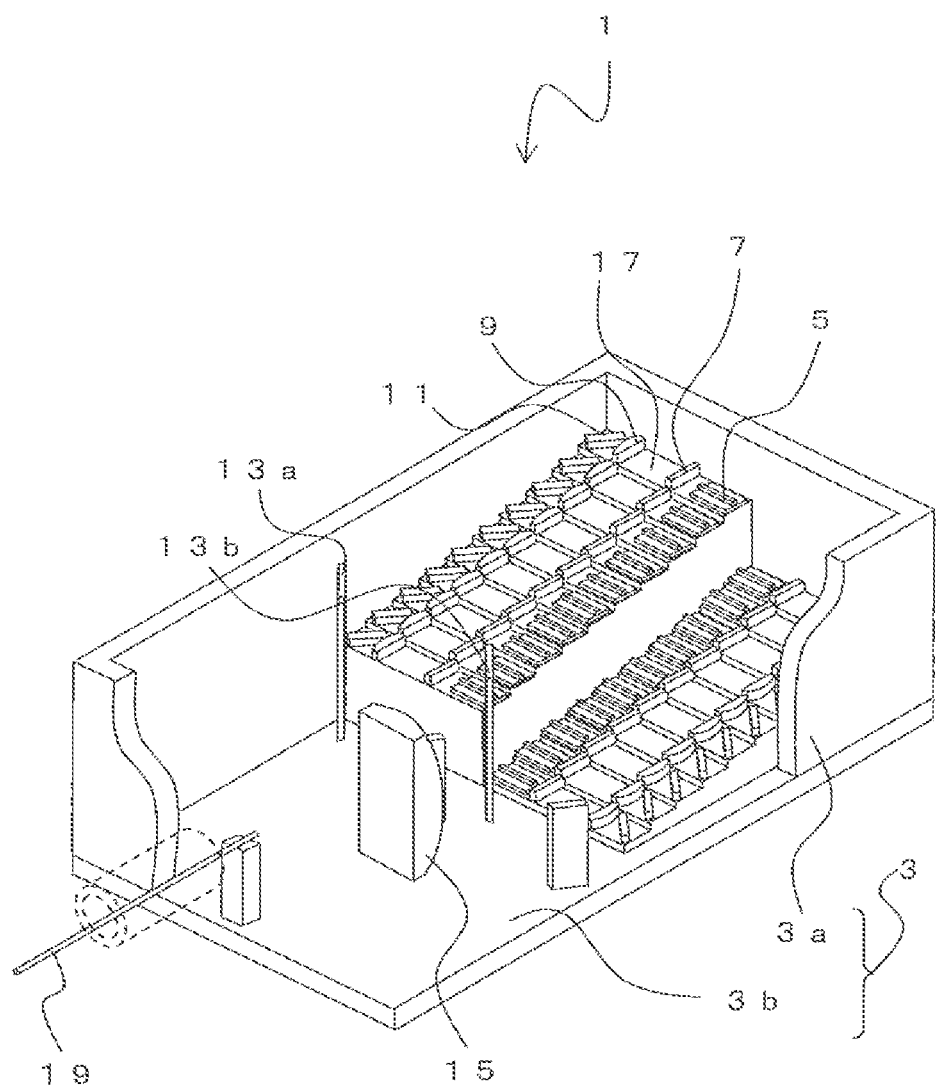
FIG. 1 is a perspective view showing a semiconductor laser module 1.
Figure 2:
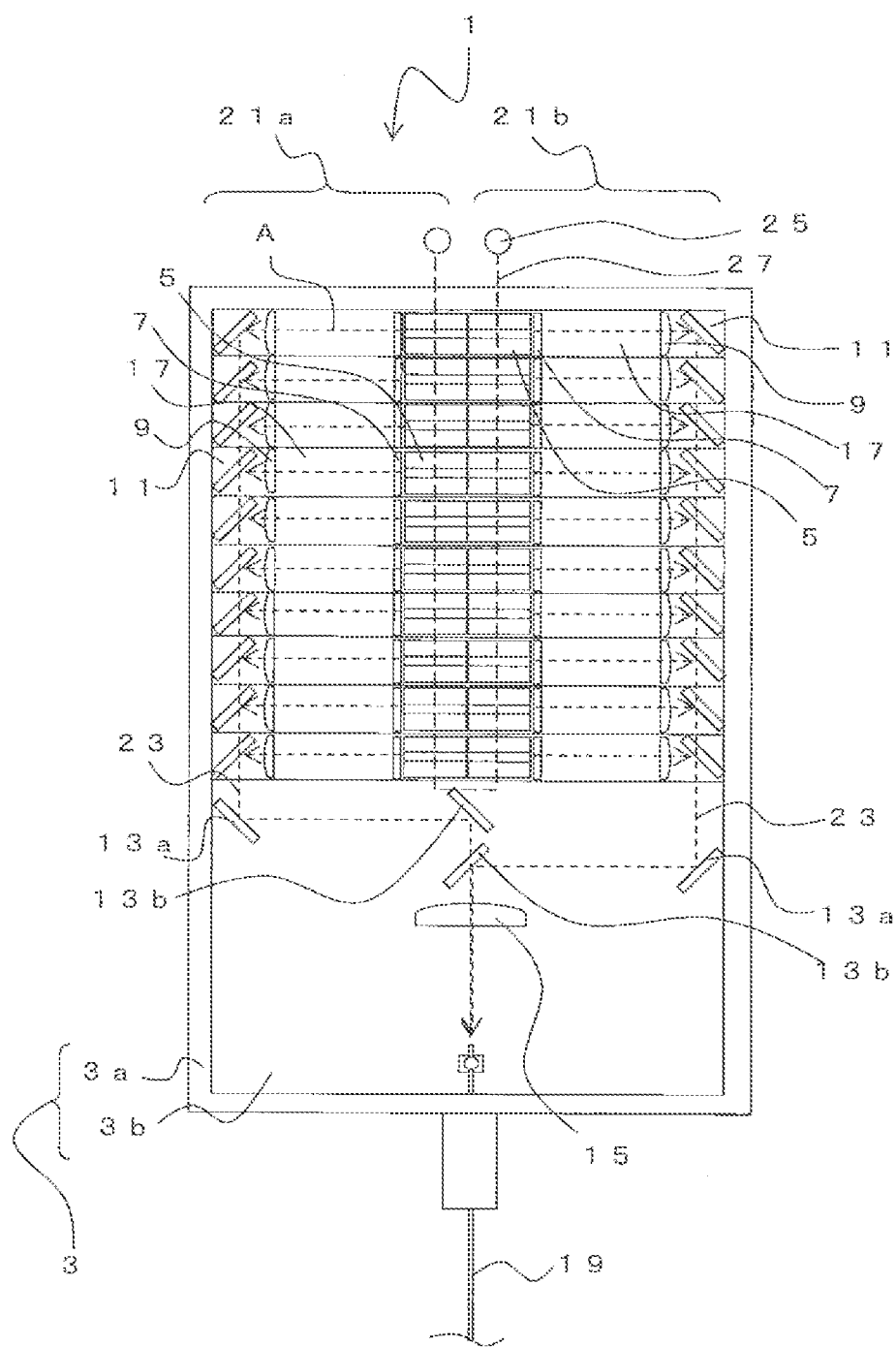
FIG. 2 is a plan view showing the semiconductor laser module 1.

Hereinafter, embodiments will be described with reference to the accompanying drawings. FIG. 1 is a perspective view showing a semiconductor laser module 1 and FIG. 2 is a plan view thereof. In FIG. 1, an upper surface and a part of sidewalls 3a on a front side of the drawing of a housing 3 are perspective and illustrations for wiring and the like are omitted. The semiconductor laser module 1 mainly includes the housing 3, semiconductor lasers 5, lenses 7 and 9, reflecting mirrors 11, 13a, and 13b, a condenser lens 15, an optical fiber 19, and so on.

The housing 3 includes sidewalls 3a and a base portion 3b. The sidewalls 3a stand approximately upright to the base portion 3b. Inside the housing 3, semiconductor laser installation platforms 17 having different heights like a staircase are formed on the base portion 3b so as to raise a height thereof. Each of the semiconductor laser installation platforms 17 has the semiconductor laser 5 installed. That is, a plurality of the semiconductor lasers 5 are provided inside the housing 3.

In front of the semiconductor laser 5 (in an emitting direction which is shown by an arrow A in FIG. 2), the lens 7 is disposed. Also, in further front thereof, the lens 9 is disposed. The lenses 7 and 9 are disposed for each of the semiconductor lasers 5 on the same semiconductor laser installation platform 17. The lenses 7 and 9 collimate light emitted by the semiconductor laser 5 in a vertical direction and a horizontal direction, respectively.

In front of the lens 9 in the emitting direction of the semiconductor lens 5, the reflecting mirror 11, which is a primary reflecting mirror, is disposed. A plurality of the reflecting mirrors 11 are disposed for each of the semiconductor lasers 5 and reflect the light collimated by the above-mentioned lenses 7 and 9 approximately perpendicularly. For each of the semiconductor lasers 5, it is possible to use the lenses 7 and 9 and the reflecting mirror 11 that are all in the same shape. Also, instead of placing the reflecting mirrors 11 on the semiconductor laser installation platforms 17, the reflecting mirrors 11 with different heights corresponding to each step may be disposed directly on the base portion 3b.

Here, the semiconductor lasers 5 are disposed in a plurality of columns in a direction that is perpendicular to the emitting direction thereof. Columns of the semiconductor lasers 5 are referred to as semiconductor laser installed columns 21a and 21b, respectively. That is, a plurality of the semiconductor lasers 5 are disposed on the semiconductor laser installation platforms 17, which is formed as a staircase to have different heights, so as to gradually raise the heights thereof with regard to the base portion 3b of the housing 3, forming the semiconductor installed columns 21a and 21b. Also, the heights of the semiconductor laser installation platforms 17 in a plurality of columns of the semiconductor laser installed columns 21a and 21b are different from each other. That is, all the semiconductor lasers 5 are at different heights.

Figure 8:
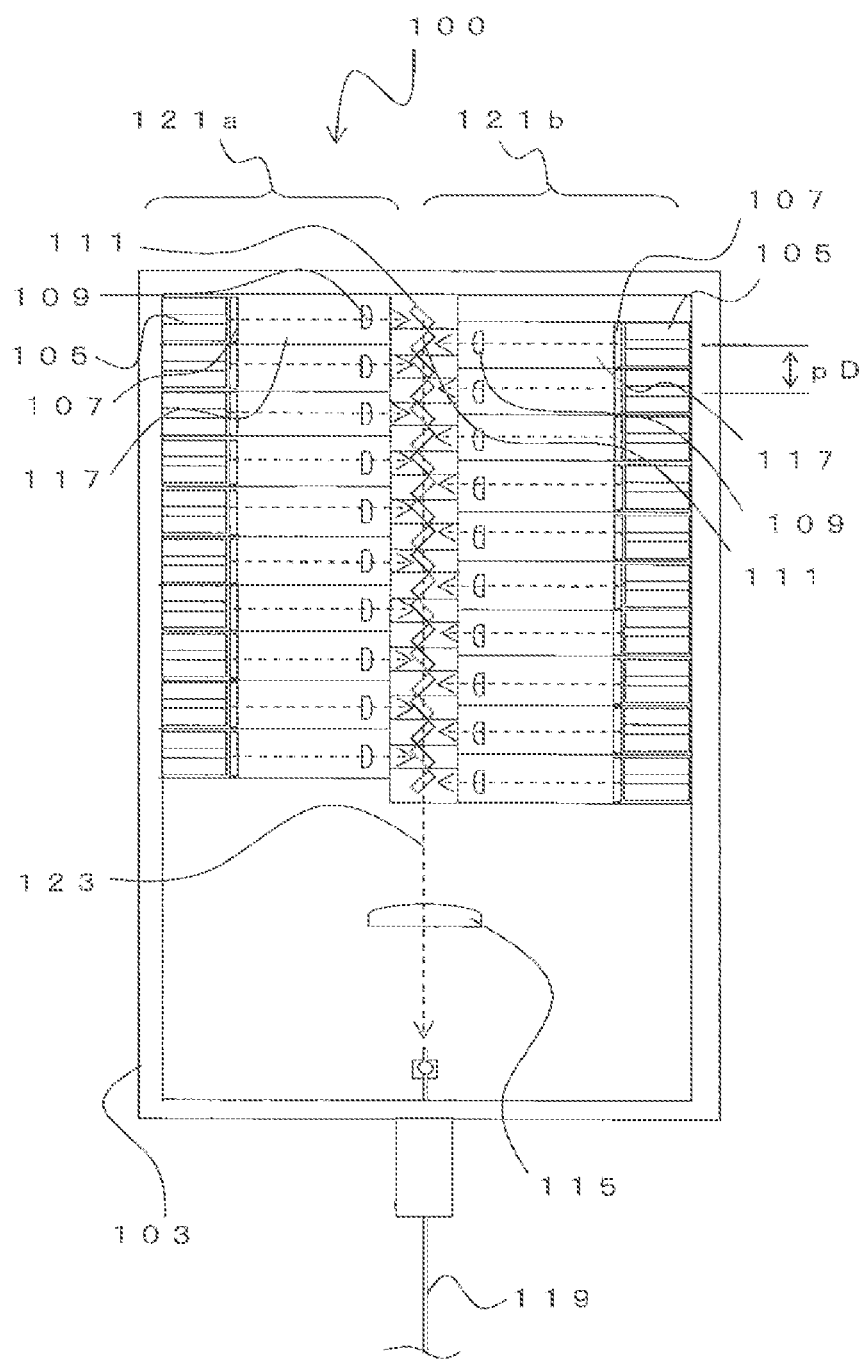
FIG. 8 is a plan view showing a conventional semiconductor laser module 100.
Figure 9:
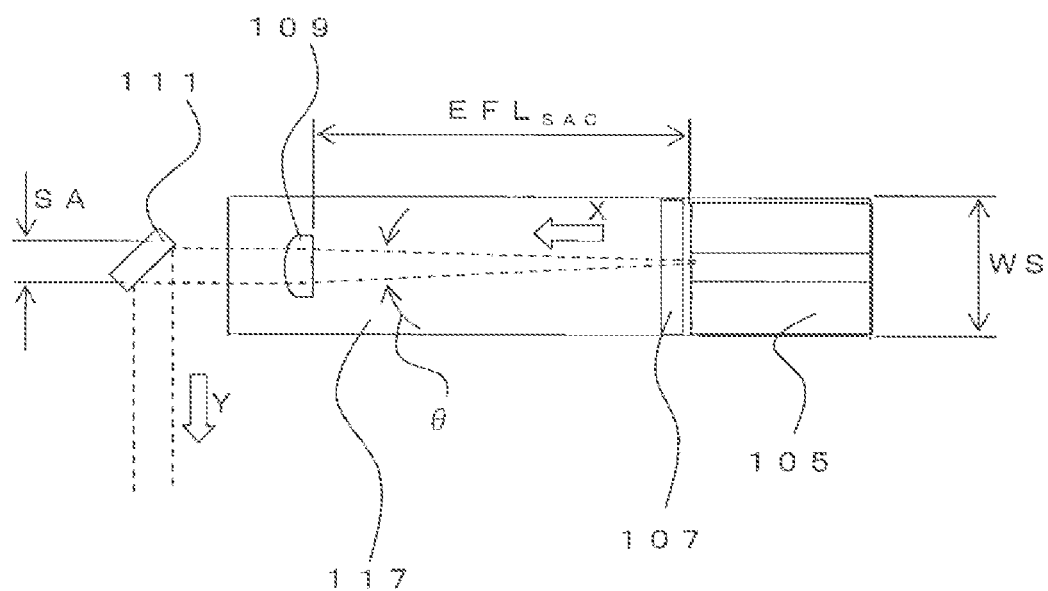
FIG. 9 is a view showing a positional relationship between a conventional semiconductor laser 105 and a reflecting mirror 111.
Figure 10:
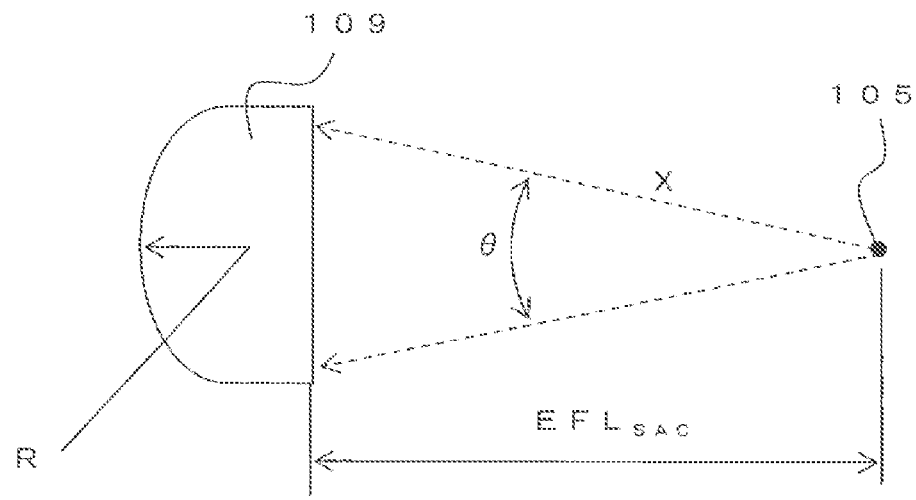
FIG. 10 is a schematic view showing the positional relationship between the conventional semiconductor laser 105 and the lens 109.

In the example shown in FIG. 2, the semiconductor lasers 5 in a pair of the semiconductor laser installed columns 21a and 21b are adjoined to each other back to back so that the emitting directions thereof are in opposite directions. That is, the semiconductor lasers 5 are disposed in two columns at an approximate center of the housing 3, and the semiconductor lasers 5 in the respective semiconductor laser installed columns 21a and 21b emit laser beams toward outside of the housing 3 in a width direction thereof. Positions of the pair of the semiconductor laser installed columns 21a and 21b in a direction in which semiconductor lasers are provided side by side (position in a vertical direction in the drawing) may be the same as shown in the drawing, or may be shifted (for a half pitch, for example, as shown in FIG. 8).

As above, a plurality of the semiconductor lasers 5 in the semiconductor laser installed column 21a are provided side by side on the semiconductor laser installation platforms 17 with respective heights and emit laser beams in approximately the same direction respectively. Similarly, a plurality of the semiconductor lasers 5 in the semiconductor laser installed column 21b are provided side by side on the semiconductor laser installation platforms 17 with respective heights and emit laser beams in approximately the same direction respectively. Also, the semiconductor lasers 5 in the semiconductor laser installed column 21a and the semiconductor lasers 5 in the semiconductor laser installed column 21b are disposed on the semiconductor laser installation platforms 17 at different heights and emit laser beams in directions that are opposite to each other.

The reflecting mirrors 11 forming the same semiconductor laser installed column 21a, or the same semiconductor laser installed column 21b, reflect light in approximately the same axial direction in an upper view, forming a beam group 23. Each of the beam groups 23 of the semiconductor laser installed column 21a and 21b are formed on both sides in a width direction of the housing 3. That is, the beam group 23 is formed for each of the semiconductor laser installed columns 21a and 21b and the beam groups 23 are formed on different axes in the upper view.

For each of the semiconductor laser installed columns 21a and 21b, reflecting mirrors 13a and 13b, which are the secondary reflecting mirrors, are provided respectively to reflect the respective beam groups 23. The reflecting mirror 13a reflects the beam group 23 approximately perpendicularly toward a direction opposite to the emitting direction of the semiconductor laser 5 (toward the center of the housing 3). Also, the reflecting mirror 13b further reflects the beam group 23 approximately perpendicularly toward the condenser lens 15. That is, a plurality of the beam groups 23 are reflected on each of the reflecting mirrors 13a and 13b so as to bring the beam groups 23 together to the approximate same axis at the center of the housing 3 in the upper view.

Figure 3:
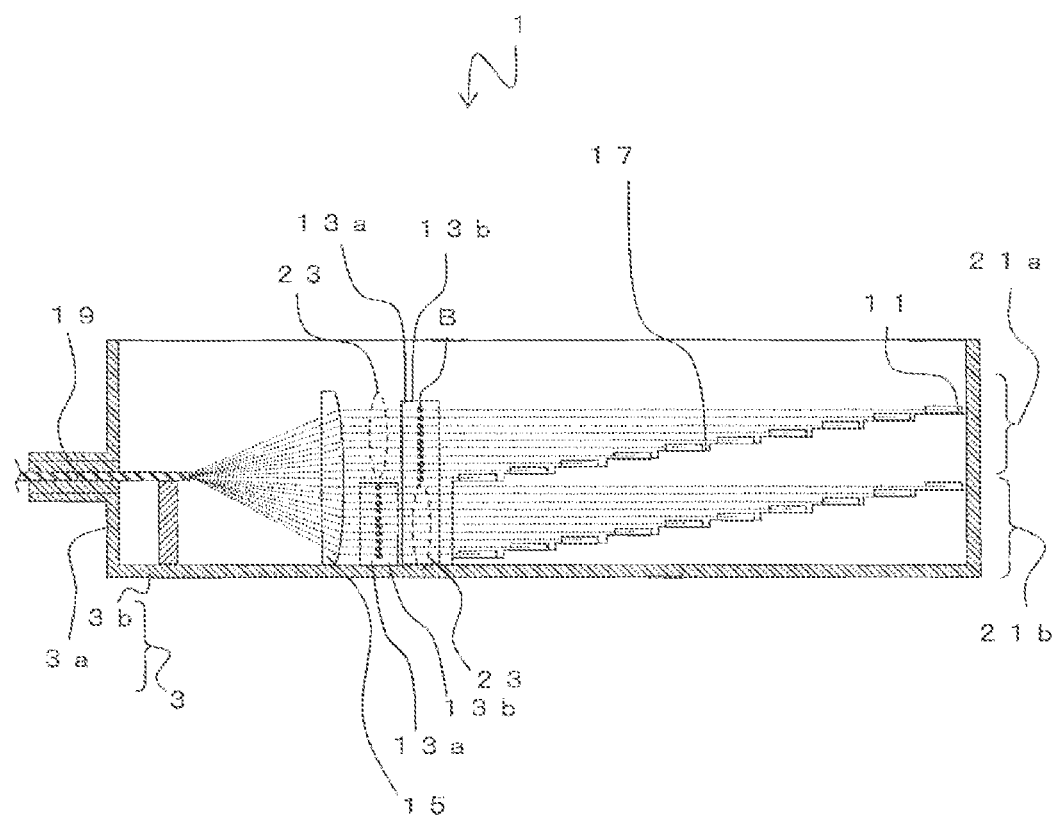
FIG. 3 is a side view showing the semiconductor laser module 1 in which each of semiconductor installed columns 21a and 21b are illustrated on a same plane.

FIG. 3 is a side view of the semiconductor laser module 1 and a schematic view in which the semiconductor laser installed columns 21a and 21b are illustrated by projecting thereof on a same drawing. In the drawing, the reflecting mirror 13a and the reflecting mirror 13b are illustrated on a same plane with their respective reflecting points of light shown by black dots (B in the drawing). The light reflected on the reflecting mirror 11 on each step passes over the reflecting mirrors 11 on the previous steps, without overlapping the reflecting mirrors 11 on the previous steps, and reaches the reflecting mirror 13a. Thus, the reflecting mirror 13a and the reflecting mirror 13b reflect the beam groups 23 at different heights all together. As mentioned above, the heights of the beam groups 23 for the semiconductor laser installed columns 21a and 21b differ from each other. For this reason, the reflecting mirror 13a and the reflecting mirror 13b that reflect the beam groups 23 to the approximate center are at heights that are different from each other so that beam groups 23 do not interfere with each other.

On the base portion 3b of the housing 3, the condenser lens 15 is fixed in a direction perpendicular to the emitting direction of the semiconductor lasers 5. The condenser lens 15 condenses a plurality of the beam groups 23 that are reflected by each of the reflecting mirrors 13b. Also, behind the condenser lens 15, the optical fiber 19 is provided so as to penetrate the sidewall 3a of the housing 3. The beam groups 23 condensed by the condenser lens 15 are optically coupled into the optical fiber 19.

The arrangement and the number of the semiconductor lasers 5, the each reflecting mirror, lenses 7 and 9, and the condenser lens 15 are not limited to the illustrated examples. For example, a plurality of the independent condenser lenses 15, which condense light in a horizontal direction and a vertical direction, respectively, may be disposed. Also, the number of the semiconductor laser installed columns may be three or more. Also, although the semiconductor lasers 5 in each of the semiconductor laser installed columns 21a and 21b are disposed at the approximate center of the housing 3 to be adjoined back to back, they may be disposed in a direction opposite thereto. However, disposing and adjoining the semiconductor lasers 5 back to back can make a wiring 27, which drives the semiconductor lasers 5, shorter and can dispose terminals 25 closer.

Figure 4:
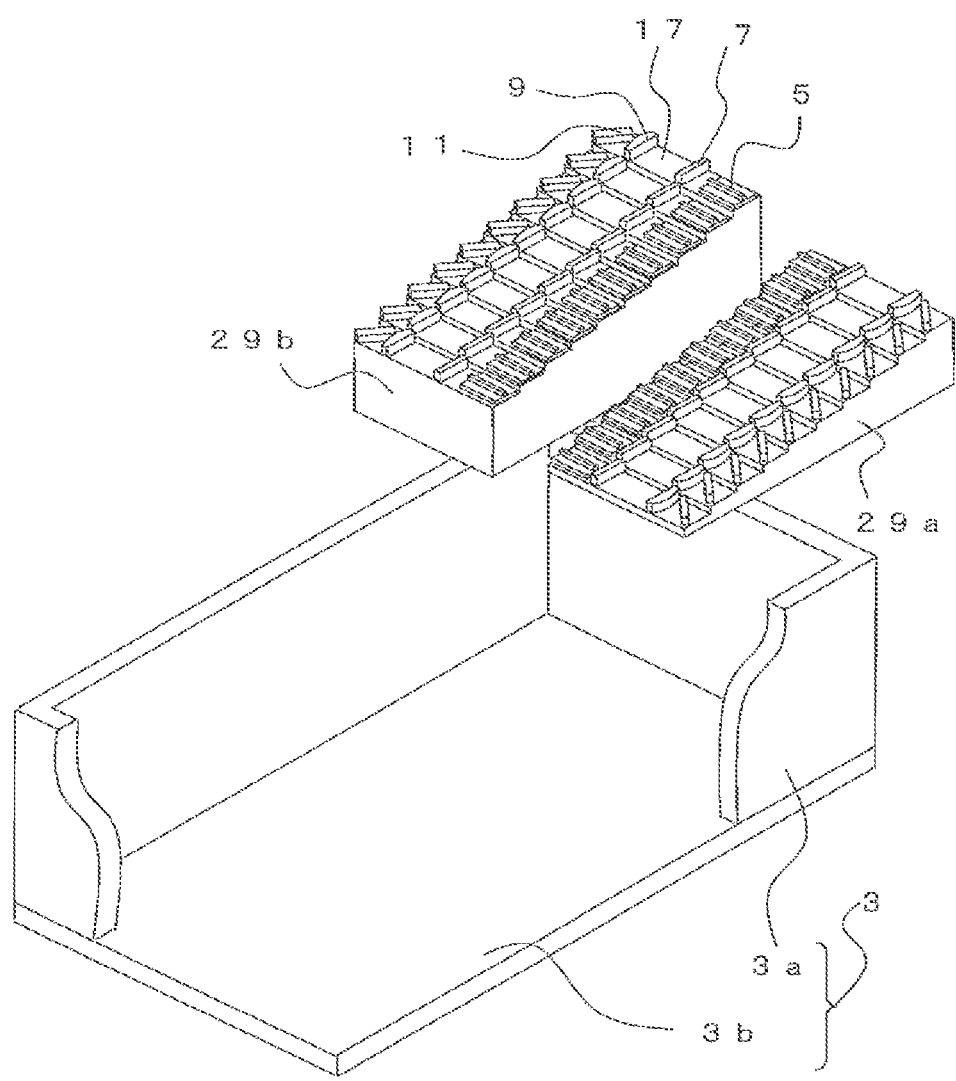
FIG. 4 is an exploded perspective view of a housing 3 and staircase-like members 29a and 29b.

Next, a method for manufacturing the semiconductor laser module 1 will be described. FIG. 4 is an exploded perspective view of the semiconductor laser module 1. For the semiconductor laser module 1, staircase-like members 29a and 29b, which are formed like staircases to raise the height, are used.

In the semiconductor laser module 1, the housing 3 and the staircase-like members 29a and 29b including the semiconductor laser installation platforms 17 are built as separate bodies. The heights of the staircase-like members 29a and 29b are different from each other. The height of the lowest semiconductor laser installation platform 17 in the staircase-like member 29b is higher than the height of the highest semiconductor laser installation platform 17 in the staircase-like member 29a.

First, the semiconductor laser 5, the lenses 7 and 9, and the reflecting mirror 11 are disposed for each of the semiconductor laser installation platforms 17 of the staircase-like members 29a and 29b having different heights, forming the semiconductor laser installed columns 21a and 21b. The positioning of the semiconductor laser 5, the lenses 7 and 9, and the reflecting mirror 11 for each of the staircase-like members 29a and 29b can be performed on each of the staircase-like members 29a and 29b, respectively.

Each of the staircase-like members 29a and 29b is joined and fixed on the base portion 3b of the housing 3. Next, the reflecting mirrors 13a and 13b are fixed on the base portion 3b of the housing 3 for each of the semiconductor laser installed columns 21a and 21b.

At this time, adjusting the reflecting mirrors 13a and 13b for each of the semiconductor laser installed columns 21a and 21b makes it easier to adjust optical axes. Thus, it is possible to lead each of the beam groups 23 reflected on the respective reflecting mirror 11 to the condenser lens 15, which then optically couples the beam groups 23 into the optical fiber 19.

Figure 5:
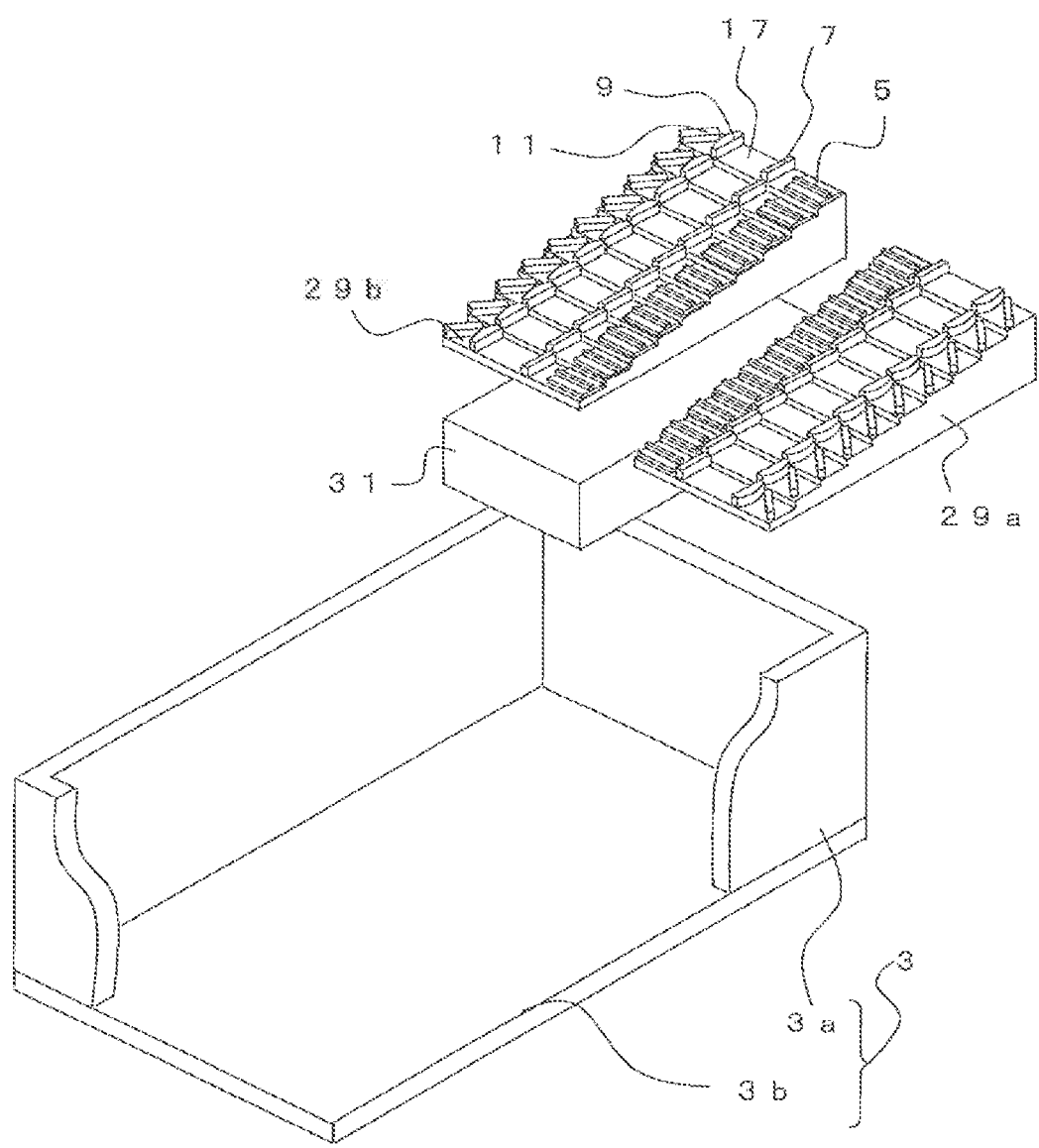
FIG. 5 is an exploded perspective view of the housing 3, the staircase-like members 29a and 29b, and a spacer 31.

Although the staircase-like members 29a and 29b having different heights are used in the example shown in FIG. 4, the presently contemplated embodiments are not limited thereto. For example, as shown in FIG. 5, a plurality of the same staircase-like members 29a may be used and a spacer 31 may be joined to a bottom surface of a part of the staircase-like members 29a. In this case, a thickness of the spacer 31 is determined so as to make the heights of the semiconductor installed columns are approximately the same as those in the case in which the staircase like member 29b is used. In this way, a plurality of the semiconductor laser installed columns can be formed with only one type of the staircase-like member 29a.

As described above, according to the present embodiment, since a plurality of the semiconductor laser installed columns 21a and 21b are disposed, the compact semiconductor module 1 can be obtained.

Also, each of the beam groups 23 is reflected along different axes when viewed from the above and then the reflecting mirrors 13a and 13b reflect the respective beam groups 23 onto the same axis. This allows an effective reflecting width of the reflecting mirror 11 to approach to a width of the semiconductor laser 5. As a result, the semiconductor laser 5 with a large θ is applicable and, since it is possible to have a longer distance between the semiconductor laser 5 and the lens 9, spherical aberration of the lens 9 can be suppressed.

Also, the semiconductor lasers 5 in each of the semiconductor laser installed columns 21a and 21b are disposed back to back. This facilitates the wiring 27 of the semiconductor lasers 5 and can shorten the wiring 27.

Also, forming the staircase-like members 29a and 29b separately from the housing 3 allows the reflecting mirrors 13a and 13b to align the optical axes after fixing the staircase-like members 29a and 29b on the housing 3. Thus, assembling of the semiconductor laser module is easy. Alternatively, the staircase-like members 29a and 29b and the housing 3 may be formed as a united body. That is, the base portion 3b may be formed like a staircase.

Figure 6:
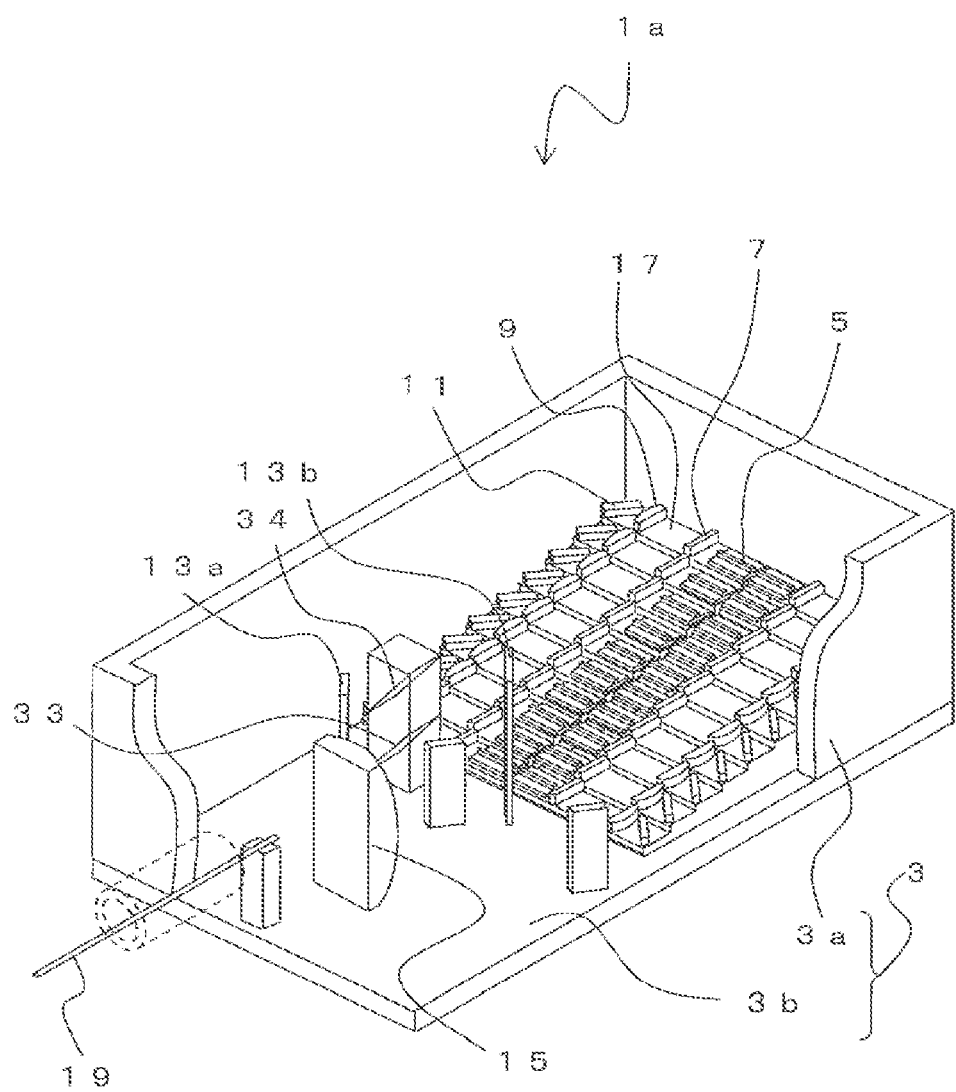

Next, a second embodiment will be described. FIG. 6 is a perspective view showing a semiconductor laser module 1a according to the second embodiment and the like. In the descriptions below, the same notations in FIG. 1 to FIG. 5 will be used for the structures with the same functions as in the semiconductor laser module 1, and redundant descriptions will be omitted.

The semiconductor laser module 1a has a structure almost similar to the semiconductor laser module 1 except for the reflecting mirrors 33 and 34 that are disposed. In the semiconductor laser module 1a, the semiconductor laser installed columns 21a and 21b are at the same height. That is, the same staircase-like member 29a can be used.

Between the reflecting mirrors 13a and 13b for one of the semiconductor laser installed columns, the reflecting mirrors 33 and 34 are disposed. The reflecting mirrors 33 and 34 reflect light entering from a side approximately perpendicularly upward first and then reflect the light approximately perpendicularly again toward the same direction as the entering direction. That is, the reflecting mirrors 33 and 34 can change the height of the entering light. The reflecting mirrors 33 and 34 in addition to the reflecting mirrors 13a and 13b are collectively referred to as secondary reflecting mirrors.

Figure 7:
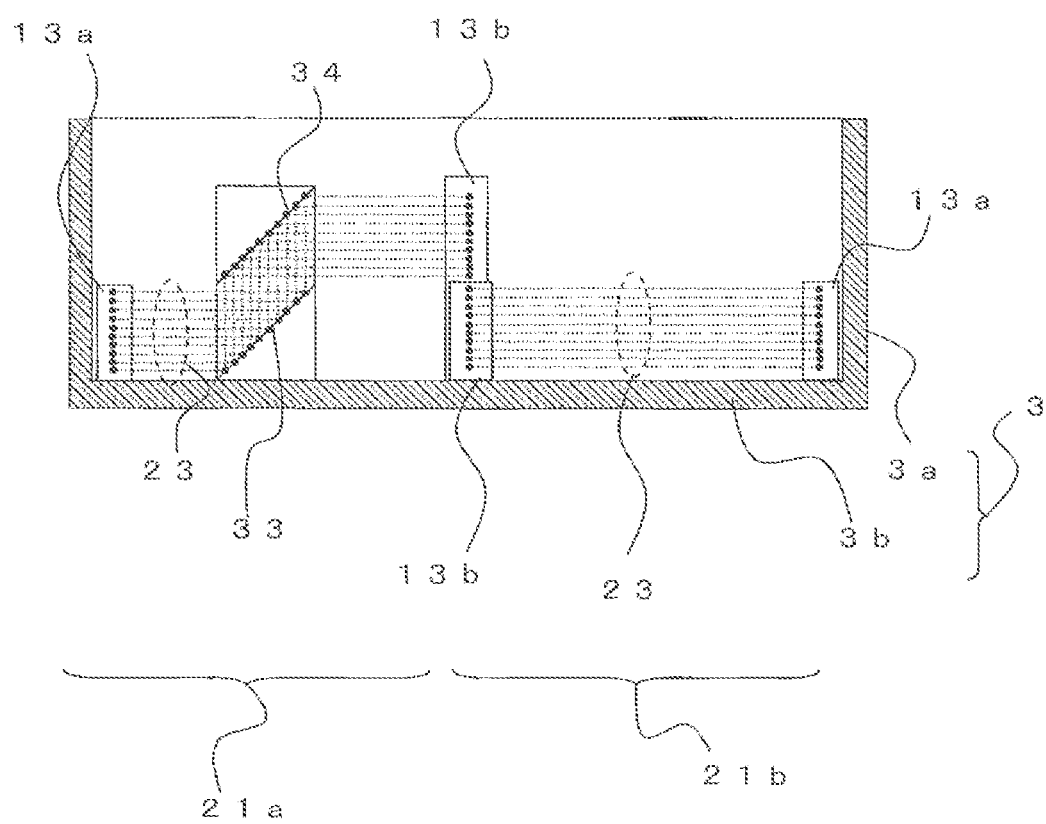
FIG. 7 is a cross sectional view showing the semiconductor laser module 1a and is a view showing optical paths.

FIG. 7 is a view (in which illustrations of the semiconductor lasers and the like are omitted) showing optical paths when viewed from an optical coupling direction side (the optical fiber). In the drawing, reflecting points of light on the reflecting mirrors 13a, 13b, 33, and 34 are shown by black dots. Also, the left side of the drawing shows the beam group 23 from the semiconductor laser installed column 21a and the right side of the drawing shows the beam group 23 from the semiconductor laser installed column 21b.

In the present embodiment, the beam groups 23 reflected by the reflecting mirrors 11 in the semiconductor laser installed column 21a and 21b respectively are at the same height. On the other hand, the reflecting mirrors 33 and 34 are disposed on the optical path of the semiconductor laser installed column 21a. That is, the reflecting mirrors 33 and 34 can change the height of the optical path of the beam group 23.

Specifically, the optical path of the beam group 23 from the semiconductor laser installed column 21a is displaced upward by the reflecting mirrors 33 and 34 so as not to overlap the beam group 23 from the semiconductor laser installed column 21b. In this way, the beam groups 23 are reflected by the reflecting mirrors 13b at different heights, respectively, and enter into the condenser lens 15.

According to the second embodiment, the same effects as in the first embodiment can be obtained. Also, it is possible to have the same semiconductor laser installation platforms 17 for the semiconductor laser installed columns 21a and 21b, and thus the same staircase-like member 29a can be used.

Although reflecting mirrors 33 and 34 are disposed between the reflecting mirrors 13a and 13b in the present embodiment, the presently contemplated embodiments are not limited thereto. For example, the reflecting mirrors 33 and 34 may be disposed on a position of the reflecting mirror 13a, and a unified reflecting mirror may be used to change the optical path in a height direction and in a travelling direction simultaneously. Also, a plurality of further reflecting mirrors may be used. Also, the reflecting mirrors 33 and 34 may be omitted by disposing the reflecting mirror 13a directing slightly upward and making the optical path approximately parallel to the base portion 3b by the reflecting mirror 13b. As above, since the secondary reflecting mirrors (the reflecting mirrors 13a, 13b, 33, and 34) change the height of the beam group 23 for at least one of the semiconductor laser installed columns, the beam groups 23 for the respective semiconductor laser installed columns 21a and 21b do not overlap in the height direction and are led into the condenser lens 15.

Although the embodiments have been described on a basis of typical sizes referring to the attached drawings, the technical scope of the present disclosure is not limited to the embodiments described above. It is obvious that persons skilled in the art can think out various examples of changes or modifications within the scope of the technical idea recited by the claims, and it will be understood that they naturally belong to the technical scope of the present disclosure.

What is claimed is:

1. A semiconductor laser module comprising:
a housing;
the plurality of semiconductor lasers that are provided inside the housing;
a lens that collimates laser beams emitted by the semiconductor lasers, respectively; and
a plurality of primary reflecting mirrors that reflect the laser beams, respectively, wherein:
a plurality of the semiconductor lasers are disposed on semiconductor laser installation platforms, which are formed as a staircase, at different heights so as to gradually raise heights thereof with regard to a base portion of the housing, the plurality of the semiconductor lasers forming respective semiconductor laser installed columns;
a plurality of the semiconductor laser installed columns are provided, with heights of the semiconductor laser installation platforms of the respective semiconductor laser installed columns being different from each other;
the primary reflecting mirrors that are included in the same semiconductor laser installed column reflect light in an approximately same axis direction to form a beam group;
the beam groups for the respective semiconductor laser installed columns are formed on different axes in upper view; and
secondary reflecting mirrors that reflect the beam groups are provided for the respective semiconductor laser installed columns and the respective secondary reflecting mirrors reflect a plurality of the beam groups collectively onto a same axis.

2. The semiconductor laser module according to claim 1, further comprising:
a condenser lens that condenses the beam groups reflected by the secondary reflecting mirrors, respectively; and
an optical fiber to which the beam groups condensed by the condenser lens are optically coupled.

3. A semiconductor laser module comprising:
a housing;
a plurality of semiconductor lasers that are provided inside the housing;
a lens that collimates laser beams emitted by the semiconductor lasers, respectively; and
a plurality of primary reflecting mirrors that reflect the laser beams, respectively, wherein:
the plurality of the semiconductor lasers are disposed on semiconductor laser installation platforms, which are formed as a staircase, at different heights so as to gradually raise heights thereof with regard to a base portion of the housing, the plurality of the semiconductor lasers forming respective semiconductor laser installed columns;
a plurality of the semiconductor laser installed columns are installed;
the primary reflecting mirrors that are included in the same semiconductor laser installed column reflect light in an approximately same axis direction to form a beam group; and
the beam groups for the respective semiconductor laser installed columns are formed on different axes in upper view,
the semiconductor laser module further comprising:
secondary reflecting mirrors that reflect the beam groups for the respective semiconductor laser installed columns;
a condenser lens that condenses the beam groups reflected by the secondary reflecting mirrors, respectively; and
an optical fiber to which the beam groups condensed by the condenser lens are optically coupled, wherein:
the secondary reflecting mirrors change a height of the beam group for at least one of the semiconductor laser installed columns and the beam groups for the respective semiconductor laser installed columns do not overlap in a height direction and are led into the condenser lens.

4. The semiconductor laser module according to claim 1, wherein a staircase-like member forming the semiconductor laser installation platforms is a separate body from the housing and is joined on the base portion of the housing.

5. The semiconductor laser module according to claim 1, wherein at least a pair of the semiconductor laser installed columns include the semiconductor lasers that are adjoined to each other back to back and emitting directions of the pair of the semiconductor laser installed columns are in opposite directions from each other.

6. A method for manufacturing a semiconductor laser module using a staircase-like member formed as a staircase to gradually raise a height, comprising:
a 'step a' of installing semiconductor lasers at each of semiconductor laser installation platforms at different heights of the staircase-like member, installing lenses for collimating laser beams emitted by the semiconductor lasers, installing a plurality of primary reflecting mirrors for reflecting the laser beams, and forming a semiconductor laser installed column;
a 'step b' of fixing a plurality of the semiconductor laser installed columns on a base portion of a housing; and
a 'step c' of fixing secondary reflecting mirrors for each of the semiconductor laser installed columns on the base portion of the housing, the secondary reflecting mirrors reflect light reflected by the primary reflecting mirrors, respectively, to an approximately same axis direction in upper view, wherein:
a plurality of the semiconductor laser installed columns are installed on the base portion and the heights of the semiconductor laser installation platforms of each of the semiconductor laser installed columns are different from each other;
the primary reflecting mirrors in each of the semiconductor laser installed columns reflect light to an approximately same axis direction in upper view to form a beam group;
the beam groups for the respective semiconductor laser installed columns are formed on different axes; and
in the 'step c', adjusting the secondary reflecting mirrors can lead the beam groups reflected by the respective primary mirrors to a condenser lens and the condenser lens can optically couple the beam groups into an optical fiber.

7. A method for manufacturing a semiconductor laser module using a staircase-like member formed as a staircase to gradually raise a height, comprising:
a 'step a' of installing semiconductor lasers at each of semiconductor laser installation platforms at different heights of the staircase-like member, installing lenses for collimating laser beams emitted by the semiconductor lasers, installing a plurality of primary reflecting mirrors for reflecting the laser beams, and forming a semiconductor laser installed column;
a 'step b' of fixing a plurality of the semiconductor laser installed columns on a base portion of a housing; and a 'step c' of fixing secondary reflecting mirrors for each of the semiconductor laser installed columns on the base portion of the housing, the secondary reflecting mirrors reflect light reflected by the primary reflecting mirrors, respectively, to an approximately same axis direction in upper view, wherein:

a plurality of the semiconductor laser installed columns are installed on the base portion;

the primary reflecting mirrors in each of the semiconductor laser installed columns reflect light to an approximately same axis direction in upper view to form a beam group;

the beam groups for the respective semiconductor laser installed columns are formed on different axes;

the secondary reflecting mirrors for at least one of the semiconductor laser installed columns change the height of the beam group and the beam groups for the respective semiconductor laser installed columns can be led into a condenser lens without overlapping in a height direction; and in the 'step c', adjusting the secondary reflecting mirrors can lead the beam groups reflected by the respective primary mirrors to a condenser lens and the condenser lens can optically couple the beam groups into an optical fiber.

8. The semiconductor laser module according to claim 3, wherein a staircase-like member forming the semiconductor laser installation platforms is a separate body from the housing and is joined on the base portion of the housing.

9. The semiconductor laser module according to claim 3, wherein at least a pair of the semiconductor laser installed columns include the semiconductor lasers that are adjoined to each other back to back and emitting directions of the pair of the semiconductor laser installed columns are in opposite directions from each other.

* * * * *